(12) United States Patent
Kalnitsky et al.

(10) Patent No.: US 6,686,250 B1
(45) Date of Patent: Feb. 3, 2004

(54) METHOD OF FORMING SELF-ALIGNED BIPOLAR TRANSISTOR

(75) Inventors: Alexander Kalnitsky, Portland, OR (US); Michael Rowlandson, Portland, OR (US); Fanling H. Yang, Beaverton, OR (US); Sang Park, Portland, OR (US); Robert F. Scheer, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/300,105

(22) Filed: Nov. 20, 2002

(51) Int. Cl.[7] .............................................. H01L 21/331
(52) U.S. Cl. ...................... 438/345; 438/348; 438/235; 438/339; 438/364; 438/369; 438/309; 438/691
(58) Field of Search ................................. 438/345, 348, 438/235, 339, 364, 369, 304, 691; 257/565, 576, 588, 370

(56) References Cited

U.S. PATENT DOCUMENTS

| 5,818,153 A | 10/1998 | Allen |
| 5,882,976 A | 3/1999 | Blair |
| 6,051,873 A | 4/2000 | Yoshihisa |
| 6,194,280 B1 | 2/2001 | Johnson |
| 6,248,650 B1 | 6/2001 | Johnson |
| 6,384,469 B1 * | 5/2002 | Chantre ..................... 257/565 |

* cited by examiner

Primary Examiner—Tom Thomas
Assistant Examiner—Thomas Magee
(74) Attorney, Agent, or Firm—Blakely, Sokoloff, Taylor & Zafman LLP (57) ABSTRACT

A self-aligned bipolar transistor and a method of formation thereof are provided. The bipolar transistor has an emitter region characterized by a y-shaped structure formed from bilayer polysilicon. The bilayer polysilicon includes a first polysilicon emitter structure and a second polysilicon emitter structure. The method of forming the bipolar transistor includes forming an emitter stack on a substrate. The emitter stack comprises the first polysilicon emitter structure and a plug structure. The emitter stack defines the substrate into a masked portion and exposed adjacent portions. The exposed adjacent portions are selectively doped with a dopant to define an extrinsic base region, wherein the dopant is blocked from entering the masked portion. After selectively doping the extrinsic base region, the plug structure is removed from the emitter stack and the second polysilicon emitter structure is formed on the first polysilicon emitter structure to define the emitter region of the bipolar transistor.

22 Claims, 9 Drawing Sheets

METHOD OF FORMING SELF-ALIGNED BIPOLAR TRANSISTOR

FIELD OF THE INVENTION

This invention relates generally to semiconductor processing, and in particular, to a method of forming a self-aligned bipolar transistor.

BACKGROUND OF THE INVENTION

Processes are known for fabrication of bipolar transistors having a self-aligned structure, using a first polysilicon layer for the extrinsic base contact and a second polysilicon layer for the emitter contact, for example, as described in an article entitled "High Speed Polysilicon Emitter Base Bipolar Transistor" by Hee K. Park et al., IEEE Electron Device Letters, EDL-7 no. 12 (December 1986). Self-alignment of the base and the emitter allows for minimization of both the extrinsic base resistance and the collector-base junction capacitance.

Another example of a double polysilicon structure is described in an article by Warnock et al. entitled "50 GHz Self-Aligned Silicon Bipolar Transistors with Ion Implanted Base Profiles", IEEE Electron Device Letters, Vol. 11, no. 10 (October 1990).

The conventional double-poly process requires a first and second polysilicon layer, and the resulting structure has a highly non-planar topography. In particular, the topography of the polysilicon layer forming the emitter may have a sharp discontinuity in the emitter region, requiring a relatively thick polysilicon layer to fill the emitter gap without voids. The latter complicates subsequent processing steps such as metallization and dielectric planarization and creates problems associated with contact imaging and contact etching. The depth differential of the contact to the emitter and the contact to the sinker is relatively large and the aforementioned are in close proximity to one another. The resulting high aspect ratio contact holes are difficult to form while preserving the underlying salicide. As such, the emitter-base junction may be damaged during etching of the emitter opening in the first polysilicon layer because there is no etch stop due to little or no etch selectivity to the underlying silicon. Damage to the emitter-base junction due to over etching may have a severe impact on the noise of the transistor for analog applications. Variable recessing of the base during silicon over etch and consequent sidewall spacer width variability may lead to variability in emitter width. The ensuing variations in emitter-base capacitance along the sidewall spacer edge and emitter polysilicon contact area may not be avoided without exacerbating the topography related problems. Furthermore, doping in the link region of the base can not be controlled independently of the base implant, leading to a higher than desirable base resistance and/or emitter-base edge leakage problems.

The latter process for a double-poly self-aligned npn bipolar transistor is complex and suffers from a number of process related problems, which lead to reliability issues in the resulting device structure.

As described in an article entitled "A High Speed Bipolar Technology Featuring Self-Aligned Single Poly Base and Submicrometer Emitter Contacts" by W. M. Huang et al. IEEE Electron Devices Letters vol. 11, no. 9 (September 1990), problems associated with etching double polysilicon structures may be avoided by fabricating the emitter contact with the first layer of polysilicon. The latter process is known as self-aligned trench isolated polysilicon electrodes (STRIPE) process. The polysilicon layer is etched to define trenches for isolating the emitter region from the base regions. A low energy boron implant into the trench region defines a link region. The trench is then filled with oxide and the emitter region is n+doped by an arsenic implant. This process reduces the possibility of etch damage of the active emitter area and avoids the highly non-planar topography of the conventional double poly process. Other process related problems remain in the polysilicon electrodes however, and additional processing steps are needed, such as etching of the polysilicon layer to form narrow trenches for isolation between the emitter and base regions.

Another approach to forming a single polysilicon self-aligned bipolar transistor, known as the ASPECT process, comprises forming a p type base region in the device well as described above, and then forming an emitter structure by depositing a layer of polysilicon, patterning and etching the polysilicon to leave an emitter structure in the form of a mesa. The emitter mesa is isolated with oxide sidewall spacers before contacts are formed to the base contact region surrounding the emitter mesa. The latter process however, does not avoid the risk of damage to the underlying silicon layer in the base contact region during the overetch of the polysilicon layer region.

In view of the above, it is apparent that there is a need to provide a bipolar transistor and a method of fabricating a bipolar transistor which reduces or avoids the above mentioned problems.

SUMMARY OF THE INVENTION

In accordance with the invention, a new and improved bipolar transistor is provided in which a sacrificial emitter stack is not required to mask link base implants from penetrating into the intrinsic device area. The bipolar transistor is fabricated in accordance with a less complicated scheme in which the emitter polysilicon stack (in contact with the base) of arbitrary dimensions serves as a mask for self-aligned (to the emitter) extrinsic base implants. The emitter polysilicon stack includes a plug structure, which is self-aligned to the emitter polysilicon feature, to block heavy p+ implants from penetrating into the n+ emitter polysilicon. The emitter polysilicon stack is also encapsulated with an oxide for protection against chemicals typically employed to subsequently remove the silicon nitride plug.

The method of forming the bipolar transistor includes forming an emitter stack on a substrate. The emitter stack comprises a first polysilicon emitter structure and a plug structure. The emitter stack defines the substrate into a masked portion and exposed adjacent portions. The exposed adjacent portions are selectively doped with a dopant to define an extrinsic base region, wherein the dopant is blocked from entering the masked portion. After selectively doping the extrinsic base region, the plug structure is removed from the emitter stack and a second polysilicon or refractory metal silicide (e.g. WSi2) emitter structure is formed on the first polysilicon emitter structure to define the emitter region of the bipolar transistor. The emitter region is characterized by a y-shaped structure formed from the bilayer polysilicon emitter structures.

Other aspects, features and techniques of the invention will become apparent to one skilled in the relevant art in view of the following detailed description of the invention.

BRIEF DESCRIPTION OF THE DRAWINGS

FIG. 2O illustrates a cross-sectional view of the exemplary semiconductor device shown at a subsequent step of the exemplary method of forming the npn bipolar transistor in accordance with the invention.

DETAILED DESCRIPTION OF THE INVENTION

Figure 1:
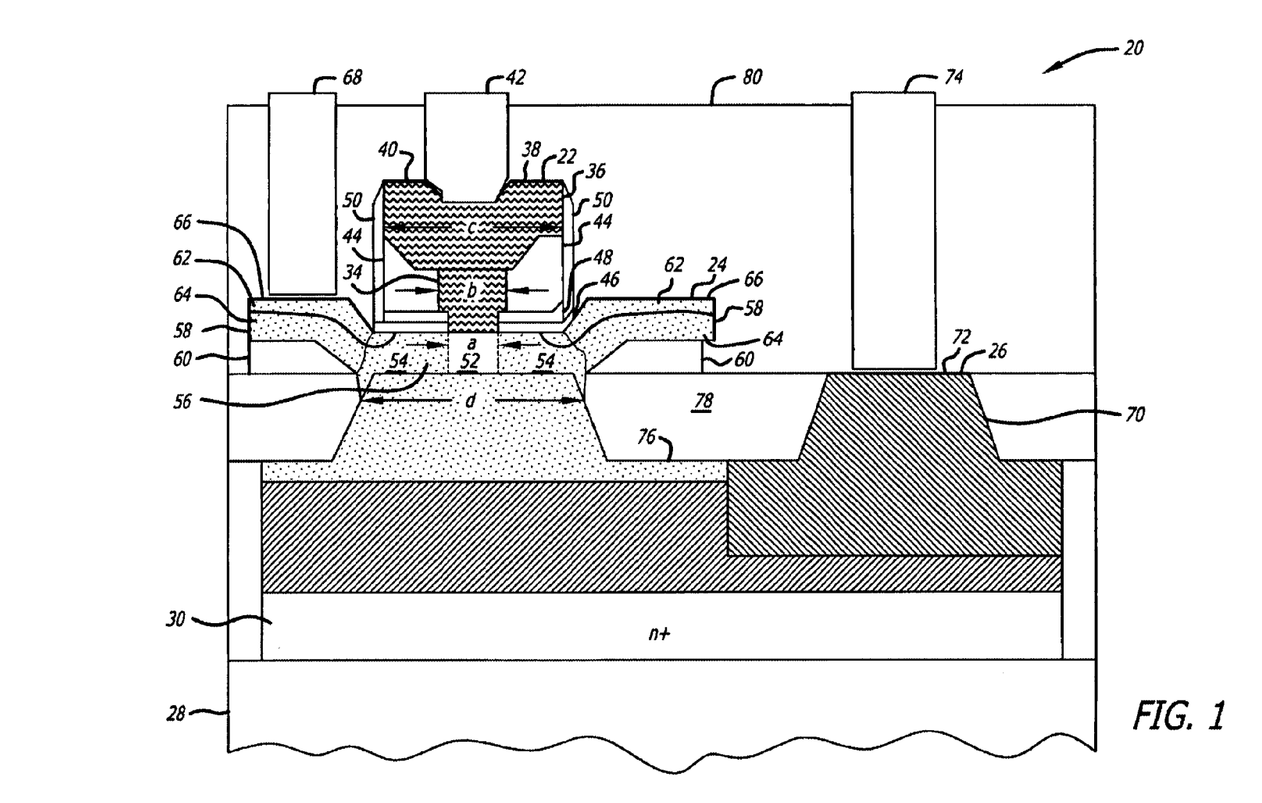
FIG. 1 illustrates a partial cross-sectional view of a npn bipolar transistor in accordance with the invention.

FIG. 1 illustrates a cross-sectional view of a npn bipolar transistor 20 in accordance with the invention. The bipolar transistor 20 has a n-type emitter region 22, a p-type base region 24, and an n-type collector region 26. The bipolar transistor 20 comprises a p-type substrate 28 having a high concentration n-type buried layer 30 and a p-type Si, SiGe or SiGe:C epitaxial layer (not shown). It shall be understood that the substrate, emitter region, base region, and collector region may be doped with the opposite conductivity, i.e. the substrate may be n-type, the emitter may be p-type, the base region may be n-type, and the collector region may p-type.

The emitter region 22 is y-shaped and comprises a first polysilicon emitter structure 34 and a second polysilicon emitter structure 36. The first polysilicon emitter structure 34 has a first portion with a width a and a second portion with a width b, wherein b may be greater than a. The first portion defines an emitter base junction width. The second polysilicon or refractory metal silicide (e.g. WSi2) emitter structure 36 has an emitter contact region 38 with a width c, wherein c is greater than b. A surface of the emitter contact region 38 made of polysilicon includes a refractory metal silicide layer 40 such as $CoSi_2$ or $TiSi_2$ to reduce contact resistance with an emitter contact 42. The second polysilicon emitter structure 36 directly abuts the first polysilicon emitter structure 34. An oxide region 44 supports the second polysilicon emitter structure 36, and a first dielectric layer 46 and a second dielectric layer 48 support the second portion of the first polysilicon emitter structure 34. In the exemplary bipolar transistor 20, the first dielectric layer 46 is silicon dioxide and the second dielectric layer 48 is silicon nitride. An emitter spacer 50 directly abuts the walls of the second polysilicon emitter structure 36 and oxide region 44. In the exemplary embodiment, the emitter spacer 50 is formed from a dielectric such as silicon dioxide.

The base region 24 has an intrinsic base region 52 and an extrinsic base region 54. The intrinsic base region 52 is defined by a mono crystalline portion 56, and the extrinsic base region 54 is defined by the mono crystalline portion 56 and a poly crystalline portion 58. The poly-crystalline portion of the base epitaxial film (Si, SiGe or SiGe:C) 58 is supported by an oxide layer 60. As can be seen in FIG. 1, the base region 24 may be further defined by a high boron concentration portion 62 and a low boron concentration portion 64. A surface of the poly crystalline portion 58 includes a refractory metal silicide layer 66 such as $CoSi_2$ or $TiSi_2$ to reduce contact resistance with a base contact 68.

The collector region 26 forms a collector base junction of width d. The collector region 26 includes a heavily doped collector plug (CC) 70 with a silicide layer 72 such as $CoSi_2$ or $TiSi_2$ or the like to reduce contact resistance with the collector region 30 and the lightly doped collector region 78. The heavily doped collector plug region 70 is isolated from regions of opposite conductivity by a shallow trench region 78. The surface of bipolar transistor 20 is coated with an insulating film 80 such as silicon dioxide.

Figure 2A:
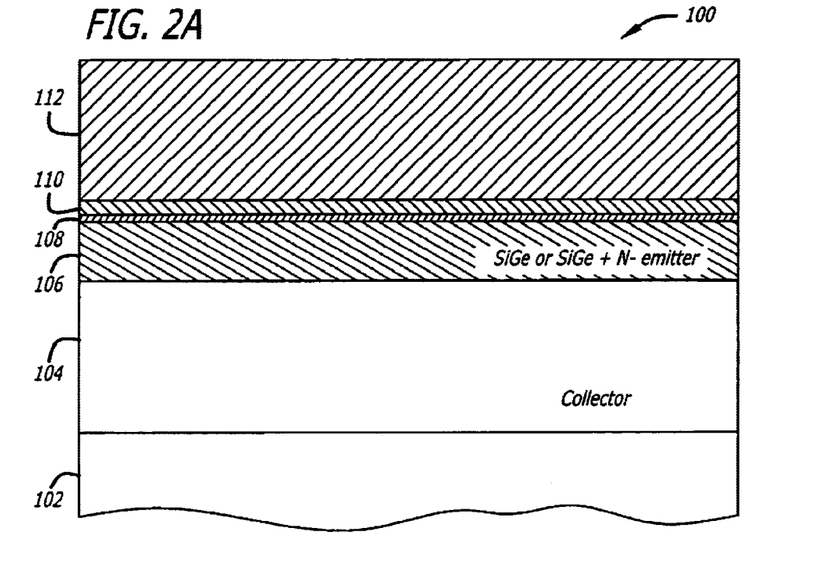
FIG. 2A illustrates a cross-sectional view of an exemplary semiconductor device shown at a step of an exemplary method of forming a npn bipolar transistor in accordance with the invention.

FIG. 2A illustrates a cross-sectional view of an exemplary semiconductor device 100 at a step of an exemplary method of forming a bipolar transistor in accordance with the invention. At this step, the semiconductor device 100 comprises a p-type Si substrate 102 having an n-doped well region 104 and a p-type Si, SiGe or SiGe:C epitaxial layer 106. A thin silicon dioxide layer 108 is formed over the p-type substrate 102. In the exemplary method, the silicon dioxide layer 108 is thermally grown to a thickness ranging from about 20 to 200 Angstroms. Also, a layer of silicon nitride 110 is deposited onto the silicon dioxide layer 108, and a top silicon dioxide layer 112 is deposited onto the silicon nitride layer 110. The silicon nitride layer 110 may be deposited by low-pressure-chemical-vapor-deposition (LPCVD) or other processes known to one skilled in the art to a thickness ranging from about 50 to 500 Angstroms, and the top silicon dioxide layer 112 may be deposited by PECVD to a thickness ranging from about 1,000 to 10,000 Angstroms.

Figure 2B:
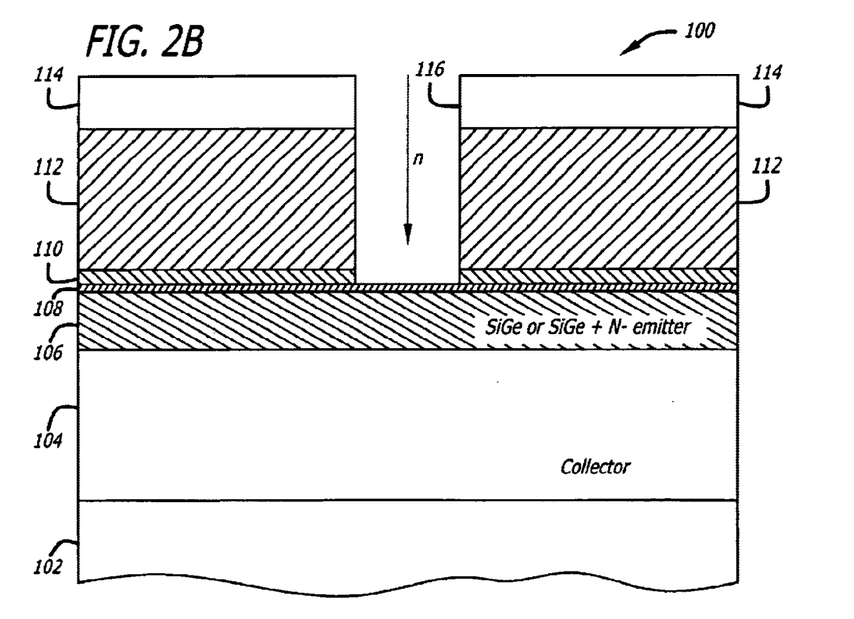
FIG. 2B illustrates a cross-sectional view of the exemplary semiconductor device shown at a subsequent step of the exemplary method of forming the npn bipolar transistor in accordance with the invention.

FIG. 2B illustrates a cross-sectional view of the exemplary semiconductor device 100 at a subsequent step of the exemplary method of forming a bipolar transistor in accordance with the invention. At this subsequent step, an emitter mask layer 114 is formed over the top silicon dioxide layer 112. In the exemplary method, the emitter mask layer 114 opens up an emitter window 116. The emitter mask layer 114 may be formed of photo resist material or other materials that can serve as a mask for a subsequent process of selectively etching the top silicon dioxide layer 112 and the underlying silicon nitride layer 110. The thin silicon dioxide layer 108 is left in place to protect the surface of the base region from contamination and to improve implant uniformity. A self-aligned collector implant is then performed by ion implanting an n-type dopant such as arsenic or phosphorus through the emitter window 116 using implant energies ranging from 80 keV to 200 keV at a dose ranging from 1E12 to 5E13 cm$^{-}$. The n-type ions pass through the base region to form a narrow medium doped region just below the base region and self aligned to the emitter opening.

Figure 2C:
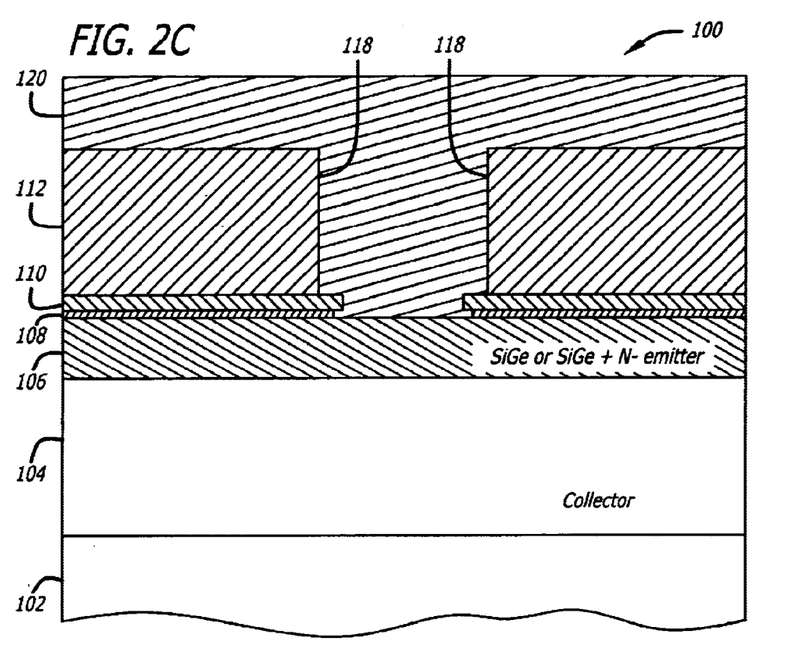
FIG. 2C illustrates a cross-sectional view of the exemplary semiconductor device shown at another subsequent step of the exemplary method of forming the npn bipolar transistor in accordance with the invention.

FIG. 2C illustrates a cross-sectional view of the exemplary semiconductor device 100 at another subsequent step of the exemplary method of forming a bipolar transistor in accordance with the invention. In this subsequent step, the thin silicon oxide layer is wet etched at the emitter window 116. During the wet etching, side walls 118 of the top oxide layer 112 are also etched and pulled back. A layer of polysilicon 120 is deposited onto the substrate 102. In the exemplary method, the polysilicon layer 120 may be in situ doped with n-type dopant while deposited by low-pressure-chemical-vapor-deposition (LPCVD), epitaxial silicon reaction, or other processes known in the art.

Figure 2D:
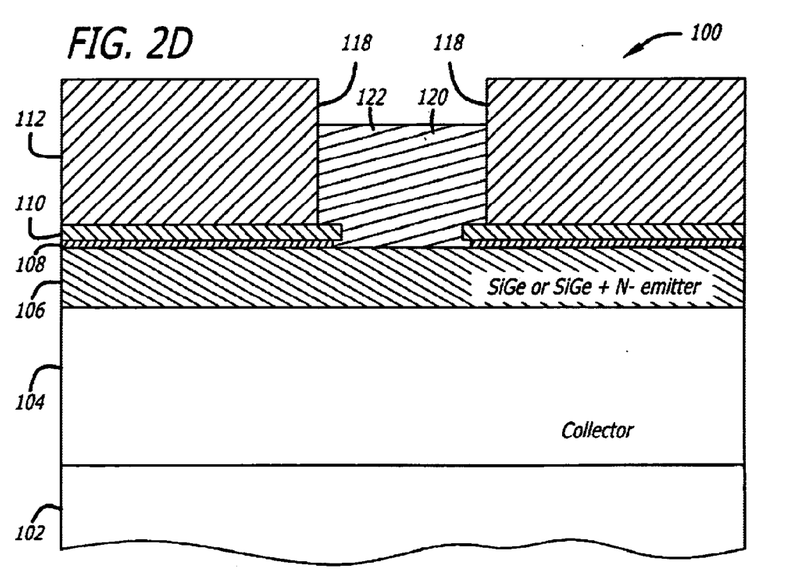
FIG. 2D illustrates a cross-sectional view of the exemplary semiconductor device shown at another subsequent step of the exemplary method of forming the npn bipolar transistor in accordance with the invention.

FIG. 2D illustrates a cross-sectional view of the exemplary semiconductor device 100 at another subsequent step of the exemplary method of forming a bipolar transistor in accordance with the invention. In this subsequent step, a first polysilicon emitter structure 122 is formed by etching back the polysilicon layer 120 to create a recess ranging from about 1,000 to 5,000 Angstroms. In the exemplary method, the polysilicon layer 120 is isotropically etched back by reactive plasma ion etching. As an alternative, the polysilicon layer 120 may be etched back by a combined process which includes chemical mechanical polishing (CMP) and etch back.

Figure 2E:
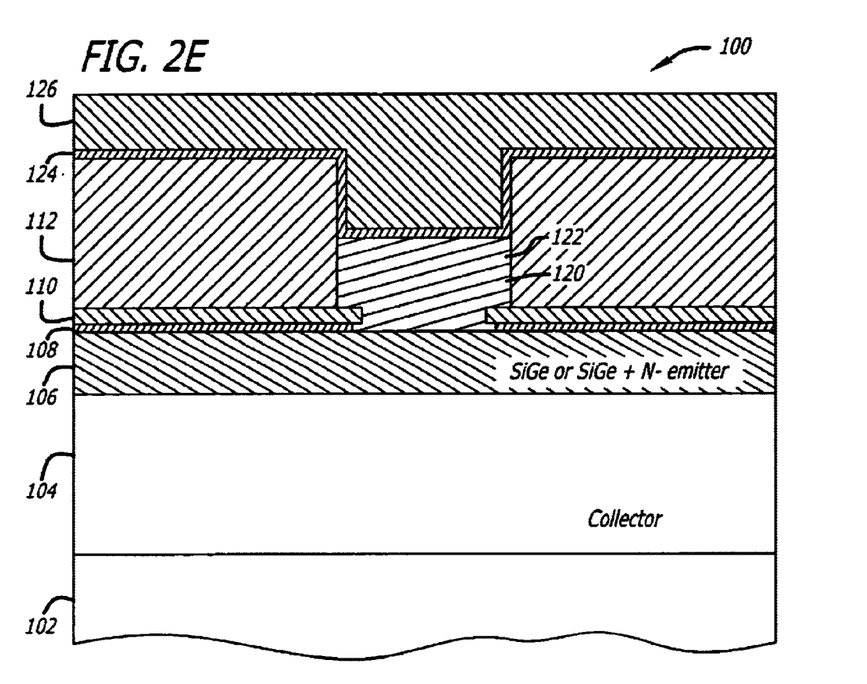
FIG. 2E illustrates a cross-sectional view of the exemplary semiconductor device shown at a subsequent step of the exemplary method of forming the npn bipolar transistor in accordance with the invention.

FIG. 2E illustrates a cross-sectional view of the exemplary semiconductor device 100 at another subsequent step of the exemplary method of forming a bipolar transistor in accordance with the invention. In this subsequent step, a thin oxide layer 124 having a thickness in the range of about 200 to 300 Angstroms is deposited on the substrate 102 to form an emitter oxide opening over the emitter polysilicon, and a layer of silicon nitride 126 having a thickness in the range of about 500 to 3,000 A is deposited on the thin oxide layer 124 to plug the emitter oxide opening. As such, the thin oxide layer 124 is interposed between the first polysilicon emitter structure 122 and silicon nitride layer 126.

Figure 2F:
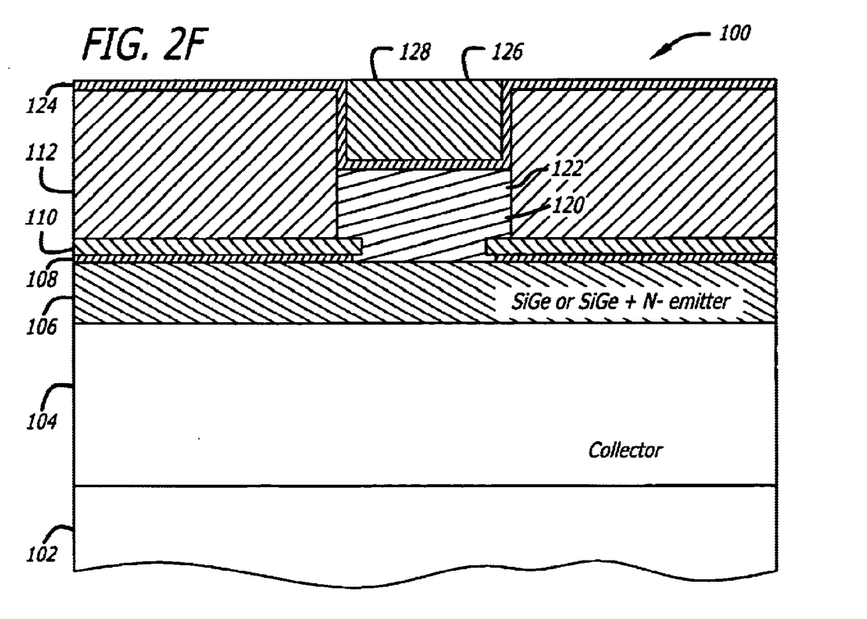
FIG. 2F illustrates a cross-sectional view of the exemplary semiconductor device shown at a subsequent step of the exemplary method of forming the npn bipolar transistor in accordance with the invention.

FIG. 2F illustrates a cross-sectional view of the exemplary semiconductor device 100 at another subsequent step of the exemplary method of forming a bipolar transistor in accordance with the invention. In this subsequent step, a silicon nitride plug 128 is formed by isotropically etching back the silicon nitride layer 126 to the extent that the silicon nitride layer 126 is coplanar with the thin oxide layer 124. In the exemplary method, the silicon nitride layer 126 is etched back by reactive plasma ion etching. As an alternative, the silicon nitride plug 128 may be formed by chemical mechanical polishing (CMP).

Figure 2G:
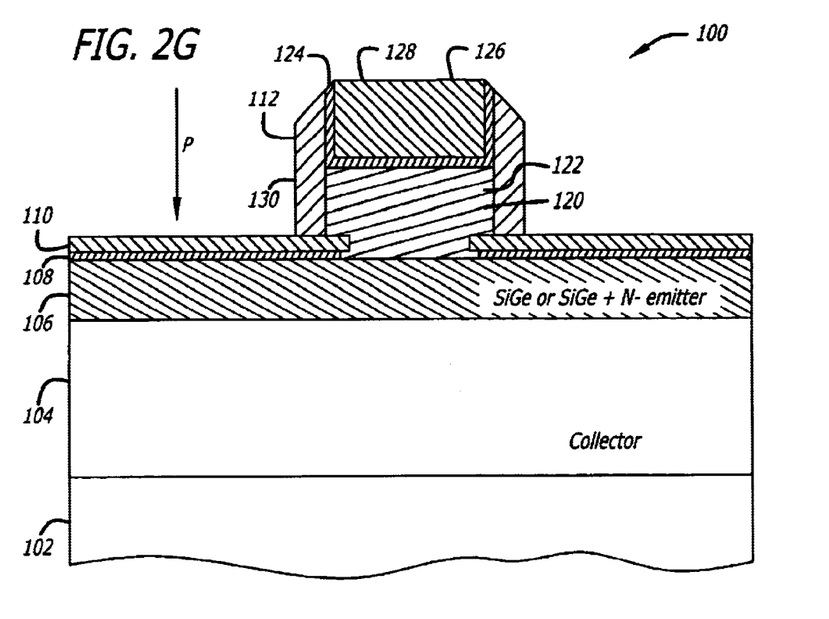
FIG. 2G illustrates a cross-sectional view of the exemplary semiconductor device shown at a subsequent step of the exemplary method of forming the npn bipolar transistor in accordance with the invention.

FIG. 2G illustrates a cross-sectional view of the exemplary semiconductor device 100 at another subsequent step of the exemplary method of forming a bipolar transistor in accordance with the invention. In this subsequent step, an emitter spacer 130 is formed by selectively etching the thin oxide layer 124 and the top silicon dioxide layer 112. Alternatively, oxide layers 124 and 112 are removed by etch, and a 500 to 2,500 Angstroms thick film of CVD oxide is deposited and an anisotropic reactive ion etch (RIE) of oxide, selective to nitride is performed to form the spacer 130. It is noted that minimal etching of the silicon nitride layer 126 occurs during the selective etching of the oxide layers 124, 112. An extrinsic base implant is performed by ion implanting p-type ions. The silicon nitride plug 128 blocks the implant from penetrating into the first polysilicon emitter structure 122, and the emitter spacer 130 prevents the implant from penetrating laterally into the first polysilicon emitter structure 122. In addition to preventing lateral implantation into the first polysilicon emitter structure 122, the emitter spacer 130 prevents implantation -into the intrinsic base region. In the exemplary method, the extrinsic base implant is performed at 5–25 keV and at a dose of 1–7E15 cm$^{-2}$. As an option, the emitter spacer 130 may thinned by etching in HF, and additional extrinsic base implants may be performed.

Figure 2H:
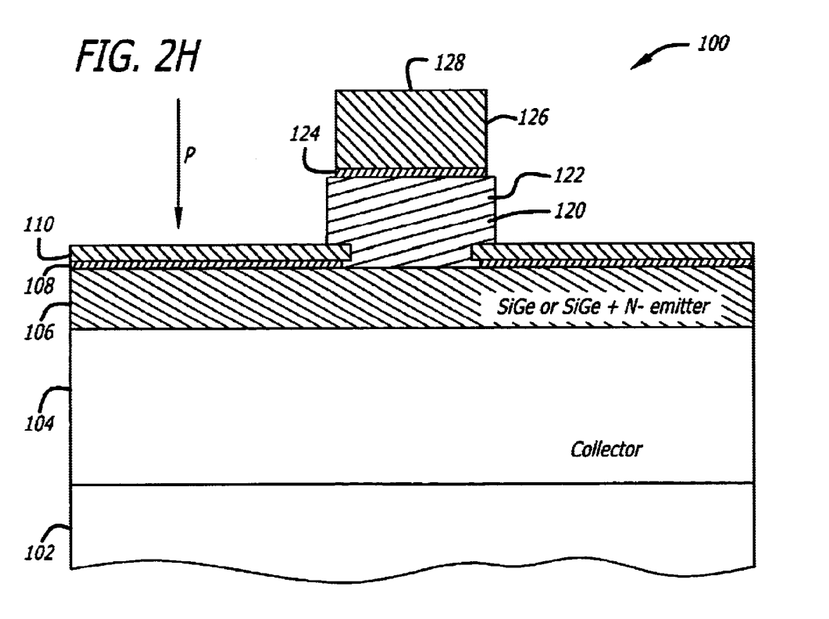
FIG. 2H illustrates a cross-sectional view of the exemplary semiconductor device shown as a subsequent step of the exemplary method of forming the npn bipolar transistor in accordance with the invention.

FIG. 2H illustrates a cross-sectional view of the exemplary semiconductor device 100 at another subsequent step of the exemplary method of forming a bipolar transistor in accordance with the invention. In this optional subsequent step, the emitter spacer 130 and the thin oxide layer 124 are selectively removed. A link base implant may be performed to link the extrinsic base region with the intrinsic base region. The link base implant may be performed at, for example, 5–25 keV and at a dose of 1–10E13 cm$^{-2}$. It is noted that removal of the emitter spacer 130 and thin oxide layer 124 is optional. It is further noted that the link base implant is optional.

Figure 2I:
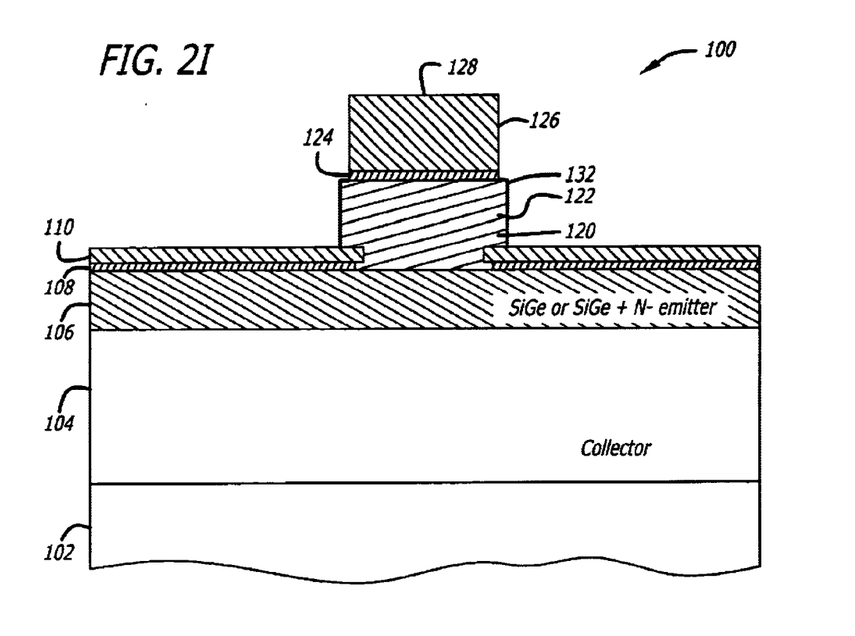
FIG. 2I illustrates a cross-sectional view of the exemplary semiconductor device shown at a subsequent step of the exemplary method of forming the npn bipolar transistor in accordance with the invention.

FIG. 2I illustrates a cross-sectional view of the exemplary semiconductor device 100 at another subsequent step of the exemplary method of forming a bipolar transistor in accordance with the invention. In this subsequent step, the first polysilicon emitter structure 122 is steam oxidized at 650 to 700° C. to form an emitter poly oxide 132. The emitter poly oxide 132 protects the heavily n+doped polysilicon emitter structure 122 from exposure to hot phosphoric acid during a subsequent etching of the silicon nitride layer 126.

Figure 2J:
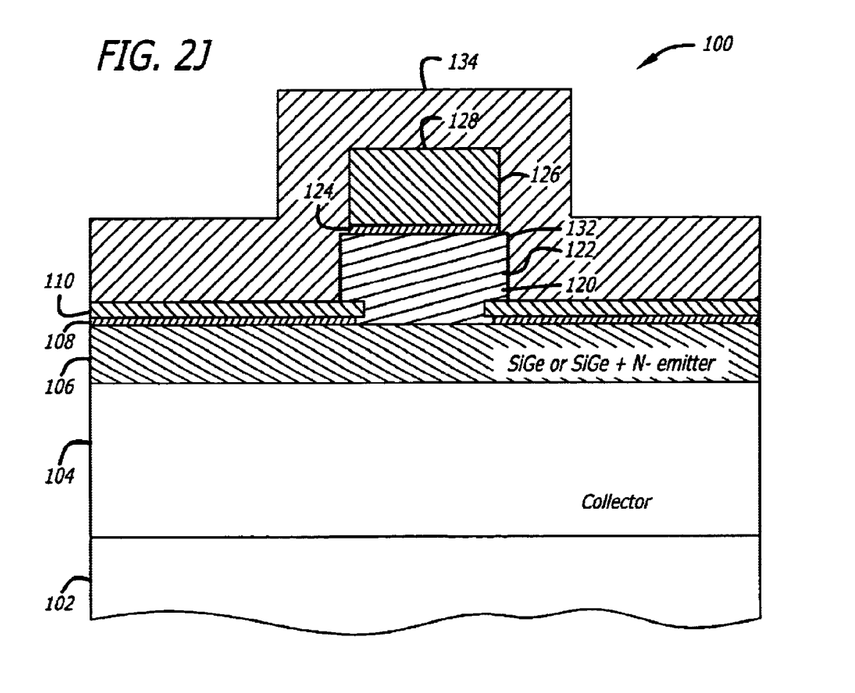
FIG. 2J illustrates a cross-sectional view of the exemplary semiconductor device shown at a subsequent step of the exemplary method of forming the npn bipolar transistor in accordance with the invention.

FIG. 2J illustrates a cross-sectional view of the exemplary semiconductor device 100 at another subsequent step of the exemplary method of forming a bipolar transistor in accordance with the invention. In this subsequent step, an emitter oxide 134 is deposited on the substrate 102. In the exemplary method, the emitter oxide 134 is a silicon dioxide layer which is deposited by low-temperature plasma-enhanced-chemical-vapor-deposition (PECVD). However, any known low temperature process may be used to deposit the silicon dioxide.

Figure 2K:
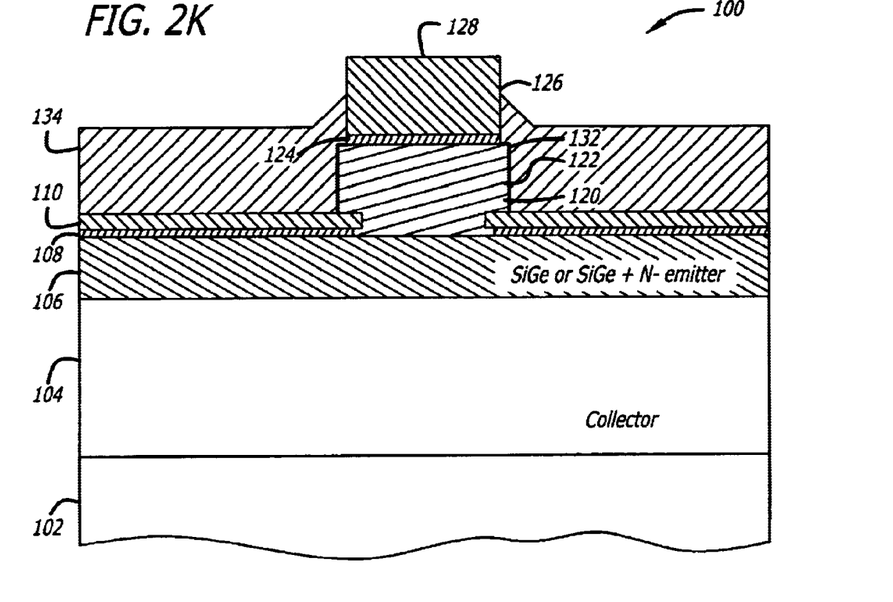
FIG. 2K illustrates a cross-sectional view of the exemplary semiconductor device shown at a subsequent step of the exemplary method of forming the npn bipolar transistor in accordance with the invention.

FIG. 2K illustrates a cross-sectional view of the exemplary semiconductor device 100 at another subsequent step of the exemplary method of forming a bipolar transistor in accordance with the invention. In this subsequent step, a portion of the silicon nitride plug 128 is exposed by chemical mechanical polishing (CMP) an upper portion of the emitter oxide 134 with a highly selectively slurry which preferentially etches silicon dioxide such that etching of the silicon nitride is minimal.

Figure 2L:
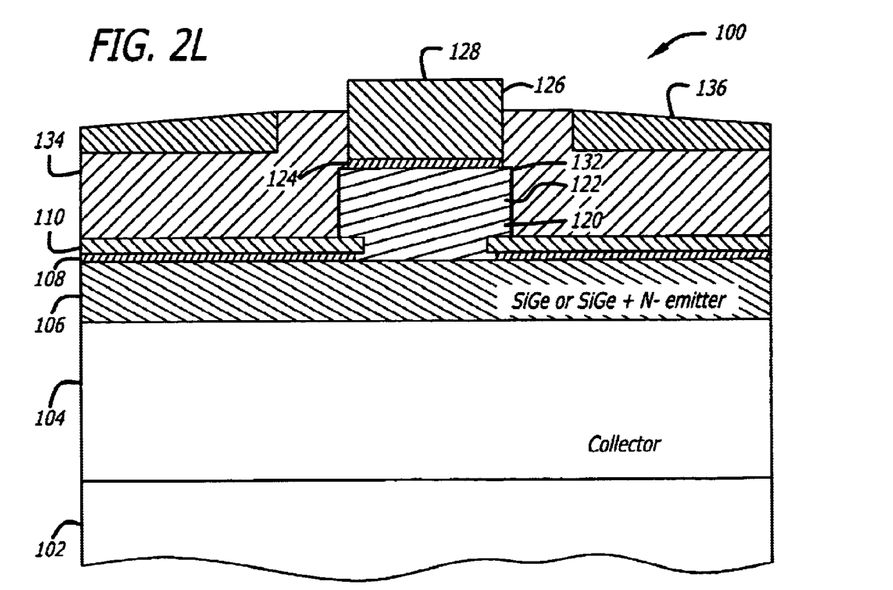
FIG. 2L illustrates a cross-sectional view of the exemplary semiconductor device shown as an alternative to the subsequent step shown in shown in FIG. 2K in accordance with the invention.

FIG. 2L illustrates an alternative method of exposing the silicon nitride plug 128. In this alternative method, a spin on glass (SOG) layer 136 is formed on the emitter oxide 134 shown in FIG. 2J to planarize the substrate surface. The spin on glass (SOG) layer 136 exhibits an etch rate which is similar to the emitter oxide 134. As can be seen in FIG. 2L, the emitter oxide 134 and spin on glass (SOG) glass layer 136 are coplanar after performing an etch back process. In the exemplary method, the spin on glass (SOG) layer 136 and the emitter oxide 134 may be etched back by reactive plasma ion etching.

Figure 2M:
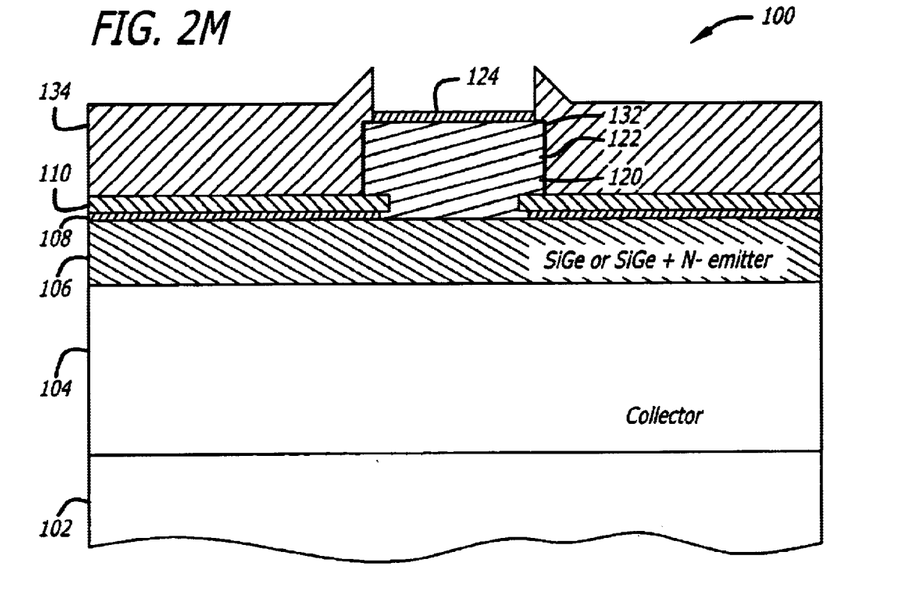
FIG. 2M illustrates a cross-sectional view of the exemplary semiconductor device shown at a subsequent step of the exemplary method of forming the npn bipolar transistor in accordance with the invention.

FIG. 2M illustrates a cross-sectional view of the exemplary semiconductor device 100 at another subsequent step of the exemplary method of forming a bipolar transistor in accordance with the invention. After exposing the silicon nitride plug 128 by chemical mechanical polishing (see FIG. 2K), the silicon nitride plug 128 is stripped by hot phosphoric acid.

Figure 2N:
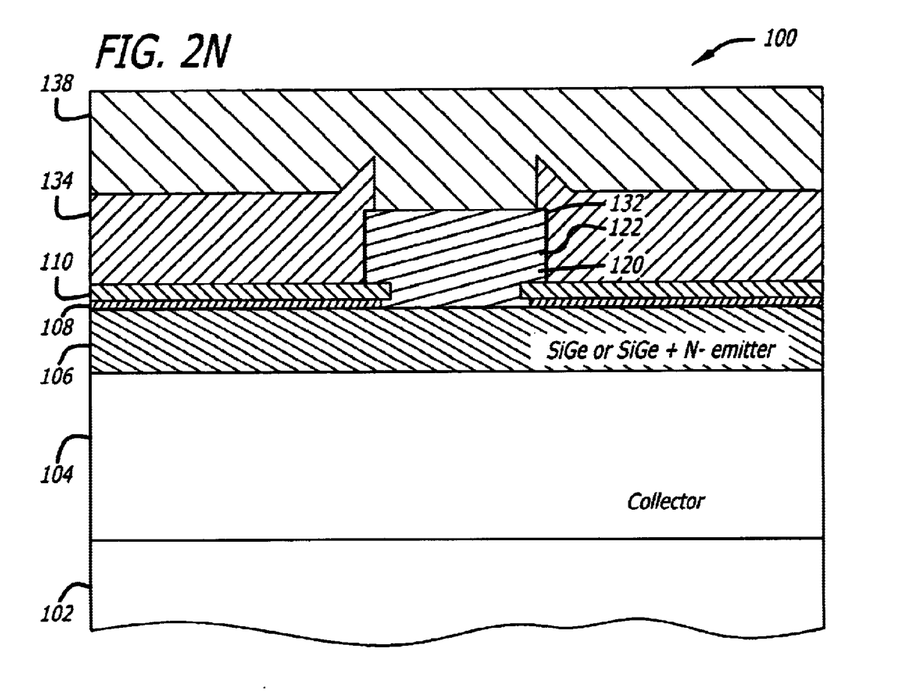
FIG. 2N illustrates a cross-sectional view of the exemplary semiconductor device shown at a subsequent step of the exemplary method of forming the npn bipolar transistor in accordance with the invention.

FIG. 2N illustrates a cross-sectional view of the exemplary semiconductor device 100 at another subsequent step of the exemplary method of forming a bipolar transistor in accordance with the invention. In this subsequent step, the thin silicon dioxide layer 124 on the first polysilicon emitter structure 122 is etched with HF, and a layer of n-doped polysilicon 138 is deposited on the substrate 102 such that an emitter stack comprises the first polysilicon emitter structure 122 and a second polysilicon emitter structure 140. The layer of n-doped polysilicon layer 138 is deposited to a thickness in a range of about 500 to 1,500 Angstrom. In the exemplary method, the polysilicon layer 138 is in-situ doped with arsenic or phosphorus. Alternatively, a metal silicide such as $WSi_2$ may be deposited in lieu of doped polysilicon to obtain a reduced emitter plug resistance. The metal silicide may be deposited by chemical-vapor-deposition (CVD) or other known processes.

FIG. 2O illustrates a cross-sectional view of the exemplary semiconductor device 100 at another subsequent step of the exemplary method of forming a bipolar transistor in accordance with the invention. In this subsequent step, the substrate 102 is selectively masked with photoresist for a subsequent process of etching the doped polysilicon layer 138, silicon dioxide layer 134, silicon nitride layer 110, and thin silicon dioxide layer 108. As an option, the surface of the extrinsic base region may be salicidated to reduce contact resistance.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive case.

What is claimed is:

1. A method of forming a bipolar transistor, comprising:
    providing a substrate having a well;
    forming an emitter stack on the substrate, wherein the emitter stack comprises a first polysilicon emitter structure and a plug structure, and wherein the emitter stack defines the substrate into a masked portion and exposed adjacent portions;
    selectively doping the exposed adjacent portions with a dopant to define an extrinsic base region, wherein the dopant is blocked from entering the masked portion;
    removing the plug structure from the emitter stack; and
    forming a second polysilicon emitter structure on the first polysilicon emitter structure to define an emitter region of the bipolar transistor.

2. The method of claim 1, wherein the bipolar transistor is a npn bipolar transistor.

3. The method of claim 2, wherein the substrate is doped with p-type dopant.

4. The method of claim 1, wherein the substrate is doped with n-type dopant.

5. The method of claim 1, wherein said forming the emitter stack comprises:
    forming a first dielectric layer over the substrate;
    forming a second dielectric layer over the first dielectric layer;
    forming a third dielectric layer over the second dielectric layer;
    forming an emitter window through the second dielectric layer and the third dielectric layer;
    selectively implanting through the emitter window and into a collector region of the substrate;
    forming a polysilicon layer over the first dielectric layer and the third dielectric layer;
    recessing the polysilicon layer relative to the third dielectric layer;
    forming a fourth dielectric layer on the polysilicon layer and the third dielectric layer;
    forming a silicon nitride layer on the fourth dielectric layer; and
    planarizing the silicon nitride layer relative to the fourth dielectric layer to form the plug structure.

6. The method of claim 5, wherein said forming the emitter stack further comprises selectively removing a portion of the fourth dielectric layer and the third dielectric layer to form an emitter spacer, wherein the emitter spacer is formed by additional oxide deposition and anisotropic reactive ion etch, and wherein the plug and the emitter spacer block the dopant from entering the masked portion when selectively doping the exposed adjacent portions to define the extrinsic base region.

7. The method of claim 6, further comprising:
    removing the emitter spacer;
    performing a link base implant; and
    oxidizing a surface of the first polysilicon emitter structure to form an oxide layer, wherein the oxide layer protects the first polysilicon emitter structure when removing the plug structure.

8. The method of claim 7, wherein said forming a second polysilicon emitter structure on the first polysilicon emitter structure comprises:
    depositing a fifth dielectric layer on the second dielectric layer and the plug structure;
    exposing a portion of the plug structure by removing a portion of the fifth dielectric layer;
    selectively remove the plug structure;
    forming a polysilicon layer on the first polysilicon emitter structure and the fifth dielectric layer; and
    selectively patterning and etching the polysilicon layer, fifth dielectric layer, second dielectric layer, and first dielectric layer to form the emitter region of the bipolar transistor.

9. The method of claim 8, wherein said forming the first dielectric layer comprises forming a thin silicon dioxide layer, wherein said forming the second dielectric layer comprises forming a silicon nitride layer, and wherein said forming the third dielectric layer comprises forming a top silicon dioxide layer.

10. The method of claim 5, wherein said forming the emitter stack further comprises selectively removing a portion of the fourth dielectric layer and the third dielectric layer to form an emitter spacer, wherein the emitter spacer is formed by additional oxide deposition and anisotropic reactive ion etch, and wherein the plug and the emitter spacer block the dopant from entering the masked portion when selectively doping the exposed adjacent portions to define the extrinsic base region.

11. The method of claim 1, further comprising:
providing the substrate with a Si or SiGe expitaxial layer, wherein the epitaxial layer is p-type.

12. A method of forming a bipolar transistor, comprising:
providing a substrate;
forming an emitter structure on the substrate, the emitter structure comprising:
a first polysilicon emitter layer;
a plug self-aligned to the first polysilicon emitter layer; and
an emitter spacer;
wherein the emitter structure defines the substrate into a masked surface portion and exposed adjacent surface portions;
extrinsic base implanting the well region with a dopant, wherein the emitter structure blocks the dopant from entering the masked surface portion, and wherein the plug and the emitter spacer block the dopant from entering the first polsyilicon emitter layer;
removing the plug from the emitter structure; and
forming a second polysilicon emitter layer on the first polysilicon emitter layer to define an emitter region of the bipolar transistor.

13. The method of claim 12, wherein the bipolar transistor is a SiGe npn bipolar transistor.

14. The method of claim 13, wherein the substrate is doped with p-type dopant.

15. The method of claim 12, further comprising:
removing the emitter spacer; and
link base implanting the substrate with a dopant.

16. The method of claim 15, further comprising:
oxidizing a surface of the first polysilicon emitter layer to form an oxide layer, wherein the oxide layer protects the first polysilicon emitter layer when removing the plug.

17. The method of claim 15, wherein said link base implanting the substrate with a dopant comprises a p+ implant.

18. The method of claim 12, wherein forming the emitter structure comprises:
forming a first dielectric layer over the substrate;
forming a second dielectric layer over the first dielectric layer;
forming a third dielectric layer over the second dielectric layer;
patterning and etching the second dielectric layer and the third dielectric layer to form an emitter window; and
selectively implanting through the emitter window to dope a collector region of the substrate.

19. The method of claim 18, wherein said forming the first dielectric layer comprises forming a thin silicon dioxide layer, wherein said forming the second dielectric layer comprises forming a silicon nitride layer, and wherein said forming the third dielectric layer comprises forming a top silicon dioxide layer.

20. The method of claim 18, wherein forming the emitter structure further comprises:
forming a polysilicon layer over the first dielectric layer and the third dielectric layer;
recessing the polysilicon layer relative to the third dielectric layer;
forming a fourth dielectric layer on the polysilicon layer and the third dielectric layer;
forming a silicon nitride layer on the fourth dielectric layer; and
planarizing the silicon nitride layer relative to the fourth dielectric layer to form the plug.

21. The method of claim 20, wherein said forming the emitter structure further comprises:
selectively removing a portion of the fourth dielectric layer and the third dielectric layer to form the emitter spacers;
link base implanting; and
oxidizing a surface of the first polysilicon emitter layer.

22. The method of claim 21, wherein forming the emitter structure further comprises:
depositing a fifth dielectric layer on the second dielectric layer and the plug;
exposing a portion of the plug by removing a portion of the fifth dielectric layer;
selectively removing the plug;
forming a polysilicon layer on the first polysilicon emitter layer and the fifth dielectric layer; and
selectively patterning and etching the polysilicon layer, fifth dielectric layer, second dielectric layer, and first dielectric layer to form the emitter region of the bipolar transistor.

* * * * *